United States Patent
Droege et al.

(10) Patent No.: US 9,176,977 B2
(45) Date of Patent: *Nov. 3, 2015

(54) COMPRESSION/DECOMPRESSION ACCELERATOR PROTOCOL FOR SOFTWARE/HARDWARE INTEGRATION

(71) Applicant: International Business Machines Corporation, Armonk, NY (US)

(72) Inventors: Hartmut Droege, Stuttgart (DE); Thomas Fuchs, Bietigheim-Bissingen (DE); Frank Haverkamp, Tuebingen (DE); Reiner Rieke, Althengstett (DE); Michael Ruettger, Aschaffenburg (DE); Anthony T. Sofia, Highland, NY (US); Joerg-Stephan Vogt, Holzgerlingen (DE); Gunnar von Boehn, Sulz am Neckar (DE); Peter B. Yocom, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/501,312

(22) Filed: Sep. 30, 2014

(65) Prior Publication Data
US 2015/0058495 A1   Feb. 26, 2015

Related U.S. Application Data

(63) Continuation of application No. 13/834,972, filed on Mar. 15, 2013.

(51) Int. Cl.
| | |
|---|---|
| *G06F 17/30* | (2006.01) |
| *G06F 9/00* | (2006.01) |
| *H03M 7/30* | (2006.01) |
| *H03M 7/40* | (2006.01) |
| *G06F 3/06* | (2006.01) |

(52) U.S. Cl.
CPC ............ *G06F 17/30153* (2013.01); *G06F 9/00* (2013.01); *H03M 7/30* (2013.01); *H03M 7/40* (2013.01); *H03M 7/6047* (2013.01); *G06F 3/0656* (2013.01)

(58) Field of Classification Search
CPC . H03M 7/3086; H03M 7/3088; H03M 7/607; H03M 7/30; H03M 7/40; G06F 3/0656; G06F 17/30153
USPC ....................................... 707/693; 341/50, 51
See application file for complete search history.

(56) References Cited

U.S. PATENT DOCUMENTS

| | | | |
|---|---|---|---|
| 8,125,357 B1 * | 2/2012 | Hamlet et al. ................. | 341/50 |
| 2006/0123308 A1 | 6/2006 | Eslick et al. | |
| 2011/0321049 A1 | 12/2011 | Hickey et al. | |

OTHER PUBLICATIONS

P. Deutsch; "Deflate Compressed Data Format Specification version 1.3;" Network Working Group; May 1996; p. 1-16.

(Continued)

*Primary Examiner* — Vincent F Boccio
(74) *Attorney, Agent, or Firm* — Cantor Colburn LLP; William A. Kinnaman, Jr.

(57) ABSTRACT

Embodiments relate to providing a data stream interface for offloading the inflation/deflation processing of data to a stateless compression accelerator. An aspect includes transmitting a request to inflate or deflate a data stream to a compression accelerator. The request may include references to an input buffer for storing input data from the data stream, an output buffer for storing processed input data, and a state data control block for storing a stream state. The stream state is provided to the compression accelerator to continue processing the data stream responsive to the request being a subsequent request. The compression accelerator is instructed to store a current stream state in the state data control block responsive to the request being a non-final request. Accordingly, the current stream state is received from the compression accelerator responsive to the request being a non-final request. The processed input data is received from the compression accelerator.

13 Claims, 7 Drawing Sheets

(56) References Cited

OTHER PUBLICATIONS

Rasmus, Integration of Hardware Accelerators Into a System-on-Chip Video Encoder, Jun. 2007, 80 pages.

T. Fujioka et al.; "Parallel Architecture for High-Speed Lempel-Ziv Data Coding/Decoding;" Systems and Computers in Japan, vol. 29. No. 8, 1998; Translated from Denshi Joho Tsushin Gakkai Ronbunshi, vol. J80-D-1, No. 11, Nov. 1997, pp. 880-888.

* cited by examiner

COMPRESSION/DECOMPRESSION ACCELERATOR PROTOCOL FOR SOFTWARE/HARDWARE INTEGRATION

DOMESTIC PRIORITY

This application is a continuation of U.S. patent application Ser. No. 13/834,972, filed Mar. 15, 2013, the disclosure of which is incorporated by reference herein in its entirety.

BACKGROUND

The present invention relates generally to storage management, and more specifically, to providing a data stream interface for offloading the inflation/deflation processing of data to a stateless compression accelerator.

With the proliferation of computers and electronic devices, the demand for more data storage space grows at an unprecedented pace. Accordingly, real time data compression algorithms are typically used to realize a more efficient use of finite storage space through the compression of data.

Contemporary applications may require that compression services use the zlib compression library to implement a DEFLATE compression algorithm to compress data and conserve storage space. DEFLATE is a typical lossless data compression algorithm that is specified in Requests for Comments (RFC) 1951. The zlib compression library generally provides a data stream based interface for inflating/deflating data. A typical data stream interface allows an application to break up input data to be inflated/deflated in arbitrary ways across multiple requests and provides arbitrary sized output buffers to hold the results of the inflate/deflate operation.

SUMMARY

According to an embodiment of the present invention, a method for providing a data stream interface for offloading the inflation/deflation processing of data to a stateless compression accelerator is provided. The method includes transmitting a request to inflate or deflate a data stream to a compression accelerator. The request may include references to an input buffer for storing input data from the data stream, an output buffer for storing processed input data, and a state data control block for storing a stream state. The stream state is provided to the compression accelerator to continue processing the data stream responsive to the request being a subsequent request. According to embodiments, the compression accelerator is instructed to store a current stream state in the state data control block responsive to the request being a non-final request according to embodiments. Accordingly, the current stream state is received from the compression accelerator responsive to the request being a non-final request. The processed input data is received from the compression accelerator according to embodiments.

According to another embodiment of the present invention, a system for providing a data stream interface for offloading the inflation/deflation processing of data to a stateless compression accelerator is provided. The system includes a computer processor and logic executable by the computer processor. The logic is configured to implement a method. The method includes transmitting a request to inflate or deflate a data stream to a compression accelerator. The request may include references to an input buffer for storing input data from the data stream, an output buffer for storing processed input data, and a state data control block for storing a stream state. The stream state is provided to the compression accelerator to continue processing the data stream responsive to the request being a subsequent request. According to embodiments, the compression accelerator is instructed to store a current stream state in the state data control block responsive to the request being a non-final request according to embodiments. Accordingly, the current stream state is received from the compression accelerator responsive to the request being a non-final request. The processed input data is received from the compression accelerator according to embodiments.

According to a further embodiment of the present invention, a computer program product for providing a data stream interface for offloading the inflation/deflation processing of data to a stateless compression accelerator is provided. The computer program product includes a storage medium having computer-readable program code embodied thereon, which when executed by a computer processor, causes the computer processor to implement a method. The method includes transmitting a request to inflate or deflate a data stream to a compression accelerator. The request may include references to an input buffer for storing input data from the data stream, an output buffer for storing processed input data, and a state data control block for storing a stream state. The stream state is provided to the compression accelerator to continue processing the data stream responsive to the request being a subsequent request. According to embodiments, the compression accelerator is instructed to store a current stream state in the state data control block responsive to the request being a non-final request according to embodiments. Accordingly, the current stream state is received from the compression accelerator responsive to the request being a non-final request. The processed input data is received from the compression accelerator according to embodiments Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
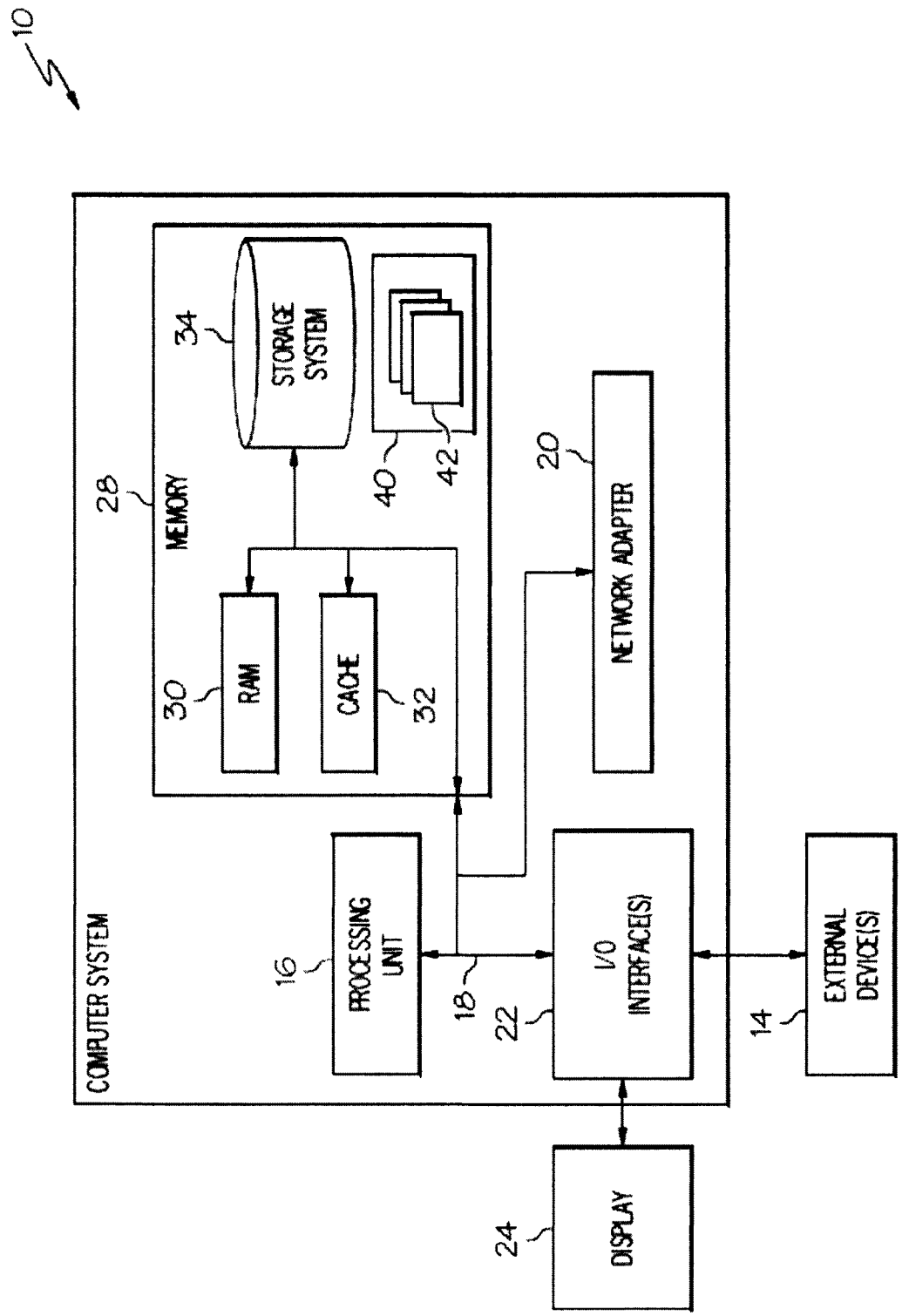
FIG. 1 depicts a block diagram of a computer system according to an embodiment.

Embodiments disclosed herein are directed to providing a data stream interface for offloading the inflation/deflation processing of data to a stateless compression accelerator. Embodiments provide the data stream interface between the stateless compression accelerator and a host driver that is compatible with a zlib compression library to inflate/deflate an input data stream.

According to embodiments disclosed herein, when the compression accelerator completes a request for a data stream under the direction of the host driver, the compression accelerator returns to the host driver all information necessary to resume the data stream on the next request. No information about the stream is maintained in the compression accelerator once it completes a request for that stream. The host driver of an embodiment maintains this returned information as a state of the stream for the life of the stream. Accordingly, on the next request for the stream, the host driver passes the state of the stream back to the compression accelerator so that the compression accelerator can restore its internal structures to continue processing the stream.

According to another aspect of embodiments disclosed herein, a relationship between an amount of data processed in a request from an application's input buffer and the amount of data returned in the application's output buffer is monitored. Accordingly, responsive to the output buffer being completely full on return from an inflate/deflate request, the application assumes that not all of the input buffer has been processed and would make a new request with the same input buffer with new output buffer space. However, responsive to the output buffer being not completely full on return from the inflate/deflate request, the application assumes that all data of the input buffer has been processed and submits a subsequent request containing the next set of data in the stream to be inflated/deflated.

A compression accelerator may implement a DEFLATE compressed data format as specified by Requests for Comments (RFC) 1951. DEFLATE is a widely used approach in data compression. However, DEFLATE may be central processing unit (CPU) intensive. Therefore, embodiments disclosed herein offload the processing from a general purpose CPU to a special purpose accelerator to process the CPU intensive aspects of the DEFLATE algorithm. A compression accelerator provides this offload capability. The compression accelerator is attached to one or more host systems through a data bus. On the host system side, the interactions with the compression accelerator are controlled by host driver software. The compression accelerator accepts work requests from the host systems to deflate (i.e., compress) or inflate (i.e., uncompress) a block of data. The compression accelerator processes one of these work requests at a time. Once the compression accelerator completes a work request, no state about that work requests is kept on the compression accelerator. It is important that the compression accelerator have this stateless characteristic so there can be no leakage of information across requests which could be coming from different applications on a host system or from different host systems.

To maximize the value of the compression accelerator, applications running on the host system may take advantage of the compression accelerator with little or no code changes. Many applications requiring compression services use the zlib compression library which implements the DEFLATE compression in software. Therefore, according to an embodiment, a zlib compatible interface is provided to allow host applications to exploit the compression accelerator. The zlib compression library provides a data stream based interface for inflating/deflating data. The data stream interface allows an application to break up the input data to be inflated/deflated in arbitrary ways across multiple requests and provides arbitrary sized output buffers to hold the results of the inflate/deflate operation. The application level interfaces for exploiting the compression accelerator must also support this stream based approach.

Accordingly, embodiments disclosed herein provide a data stream interface for inflating/deflating data that can offload processing to a stateless compression accelerator. Embodiments allow the data to be inflated/deflated to be broken up across an arbitrary number of requests to the compression accelerator with no state kept between requests by the compression accelerator. Further, embodiments match the amount of input data processed for one request to the amount of output buffer space provided by the application. Additionally, embodiments overcome issues arising from the fact that data compressed in the DEFLATE format is a bit string but application input and output buffers are byte aligned.

Referring now to FIG. 1, a block diagram of a computer system 10 suitable for providing a data stream interface for offloading the inflation/deflation processing of data to a stateless compression accelerator according to exemplary embodiments is shown. Computer system 10 is only one example of a computer system and is not intended to suggest any limitation as to the scope of use or functionality of embodiments described herein. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a general-purpose computing device, also referred to as a processing device. The components of computer system may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, and data archival storage systems, etc.

Figure 2:
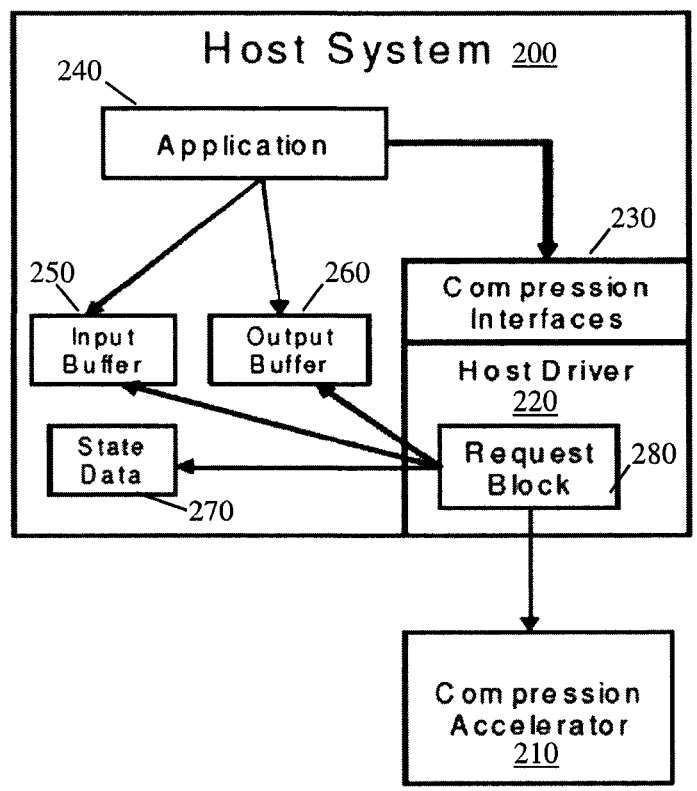
FIG. 2 depicts a block diagram of a host system and a compression accelerator of an embodiment.

With reference to FIG. 2, a block diagram of a host system 200 and a compression accelerator 210 of an embodiment are generally shown. According to an embodiment, the host system 200 and the compression accelerator 210 may be implemented using the processing unit 16 in combination with the other components of the computer system 10 described in FIG. 1.

The host system 200 of an embodiment may be connected to the compression accelerator 210. According to an embodiment, the compression accelerator 210 may be shared among multiple host systems, but for simplicity only one host is shown in FIG. 2. The interaction between the compression accelerator 210 and the host system 200 may be controlled by a host driver 220 according to an embodiment. The host driver 220 of an embodiment may provide one or more application compression interfaces 230, which are compatible with a zlib compression library.

To inflate or deflate a stream of data, an application 240 may make one or more request calls to the compression interface 230 of the host driver 220. On each request call, the application 240 of an embodiment may supply an input buffer 250 with the data to be processed and an output buffer 260 where the processed data results may be stored. On the first request of a stream, the host driver 220 may generate a state data control block 270 which may include a stream state for the data stream and may exist for the life of the data stream according to an embodiment. For each request call, the host driver 220 may generate a request block 280 with references to the stream state and the application's input buffer 250 and output buffer 260 according to an embodiment.

To begin processing the request, the compression accelerator 210 may read the request block 280 according to an embodiment. The compression accelerator 210 of an embodiment may process the data in the input buffer 250 and may save the resulting inflated/deflated data in the output buffer 260. According to an embodiment, the compression accelerator 210 may also save an updated stream state when directed by the host driver 220.

Figure 3:
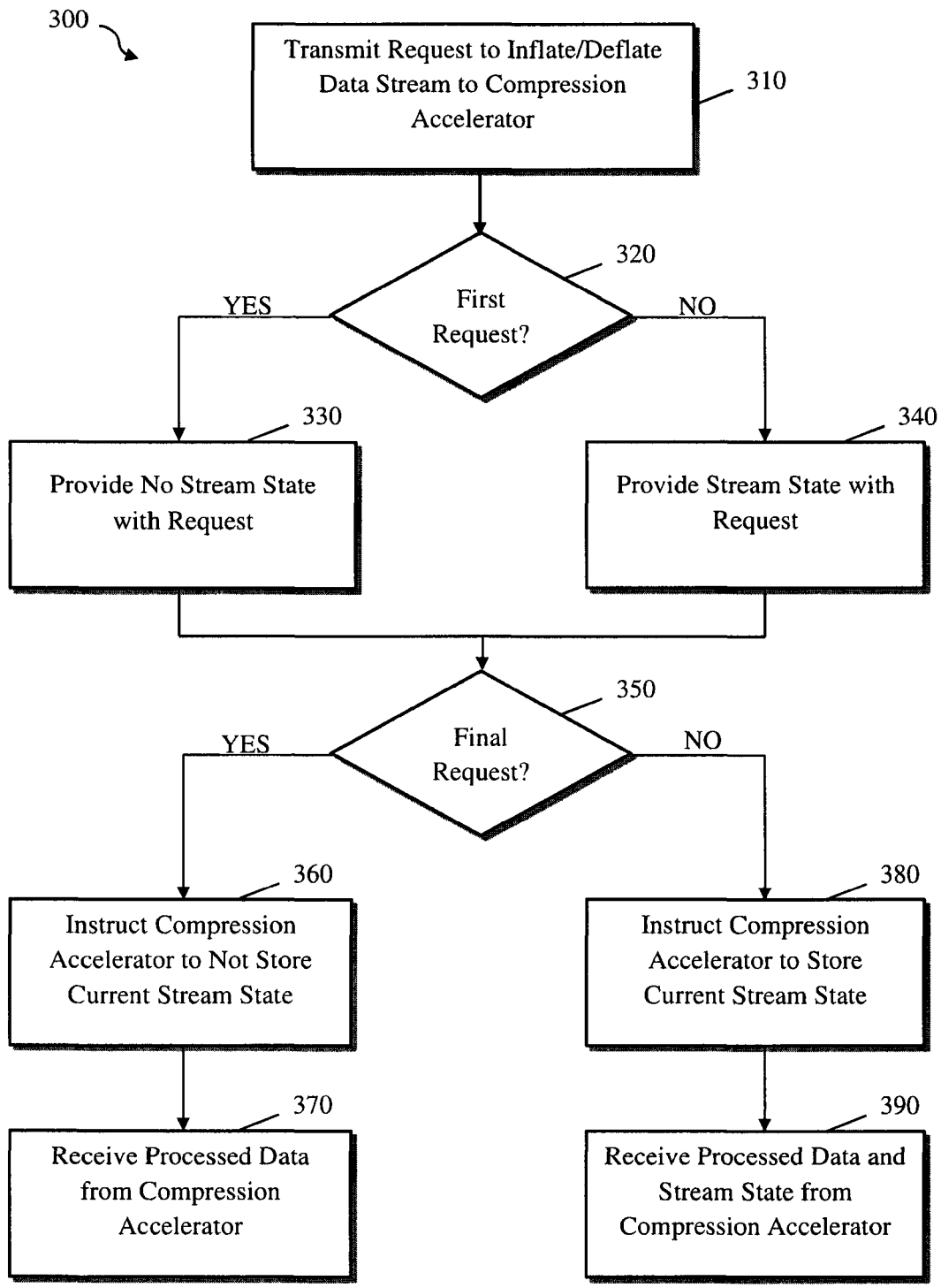
FIG. 3 depicts a flow diagram of a process for managing the state of a data stream in a data stream interface according to an embodiment.

With reference to FIG. 3, a process 300 for managing the state of a data stream in a data stream interface according to an embodiment is generally shown. The data stream interface of an embodiment offloads the inflation/deflation processing of data to a stateless compression accelerator 210. According to an embodiment, the process 300 may be implemented by the processing unit 16 of the computing system 10 shown in FIG. 1.

At block 310 of FIG. 3, the host driver 220 transmits a request to the compression accelerator 210 to inflate/deflate a data stream according to an embodiment. Each transmitted request from the host driver 220 may include references to the state data control block 270 and the input buffer 250 and the output buffer 260 of the host application 240 according to an embodiment. The input buffer 250 of an embodiment includes data to be processed by the compression accelerator 210. The output buffer 260 of an embodiment is where the data processed by the compression accelerator 210 may be stored. The state data control block 270 of an embodiment includes stream state for the requested data stream.

At block 320, an embodiment determines whether the transmitted request in block 310 is a first request for a data stream. On the first request to the compression accelerator 210, the host driver 220 may generate a state data control block 270 according to an embodiment. The state data control block 270 may exist for the life of the data stream according to an embodiment. Because the state data control block 270 is initially empty, the host driver 220 does not provide a stream state for the input data to the compression accelerator 210 on the first request, as shown in block 330. If, however, it is determined that the transmitted request is not a first request for the data stream, the host driver 220 may provide the stream state from the previous request to the compression accelerator 210 according to an embodiment, as shown in block 340. According to an embodiment, the compression accelerator 210 may receive the input stream state to bring the compression accelerator 210 back to the state it was in after the last operation for the data stream.

At block 350, an embodiment determines whether the transmitted request in block 310 is a final request for a data stream.

If the request is a final request for the data stream, the host driver 220 instructs the compression accelerator 210 not to store the stream state in the state data control block 270 after the request is completed according to an embodiment, as shown in block 360. To begin processing the request, the compression accelerator 210 may read the request block 280 received from the host driver 220 according to an embodiment. Accordingly, at block 370, the host driver 220 of an embodiment receives the processed data in the output buffer from the compression accelerator 210.

If the request is not a final request for the data stream, however, the host driver 220 instructs the compression accelerator 210 to store the stream state in the state data control block 270 after the request is completed according to an embodiment, as shown in block 380. The compression accelerator 210 of an embodiment may then process the data in the input buffer 250 and save the resulting inflated/deflated data in the output buffer 260, as shown in block 390. As shown in block 390, when the compression accelerator 210 completes the request, the compression accelerator 210 also transfers the current stream state back to the host's state data control block 270 according to an embodiment.

The DEFLATE compression algorithm introduces specific requirements on the stream state of an embodiment. Two data structures that the DEFLATE algorithm requires in the stream state of an embodiment are a dictionary and Huffman Tree.

The DEFLATE algorithm uses a dictionary to find repeated strings in the data to be deflated so a repeated string can be replaced by reference to an earlier occurrence of the string. The inflation process uses a dictionary to replace these references with the actual string in the inflated data. The dictionary is a fixed size and is equivalent to the last processed subset of data for that given fixed size. For deflate this would be in input data and for inflate this would be the output data. In both the inflate and deflate cases, this dictionary is updated as the stream is processed and may be part of the stream state of an embodiment.

The DEFLATE algorithm also uses a Huffman encoding technique. Huffman encoding allows symbols to be replaced by codes of variable bit length. Shorter bit length codes are assigned to more frequently occurring symbols. A symbol is either a byte in the data to be deflated or a reference to a repeated string. The codes are called Huffman symbol codes. The Huffman tree may represent this encoding according to an embodiment.

The Huffman encoding technique may also require an additional state to be saved. The compression accelerator 210 of an embodiment reads and writes full bytes from the application's buffers. However, the Huffman encoding implies that deflated data is a bit stream without regard to byte boundaries. For a stream being deflated, the last byte written to the application's output buffer 260 may be only a partial Huffman symbol code. The remaining bits of this Huffman symbol code must be saved in the stream state of an embodiment so that these remaining bits can be added to the output buffer 260 of the next request for the stream before any additional input data is processed. In the case of a stream being inflated, the last bytes of the input buffer 250 may be a partial Huffman symbol code according to an embodiment. The bits that represent that partial Huffman symbol code must be save in the stream state of an embodiment so they can be used to create the entire Huffman symbol code when new input data becomes available with the next request for the stream.

Figure 4:
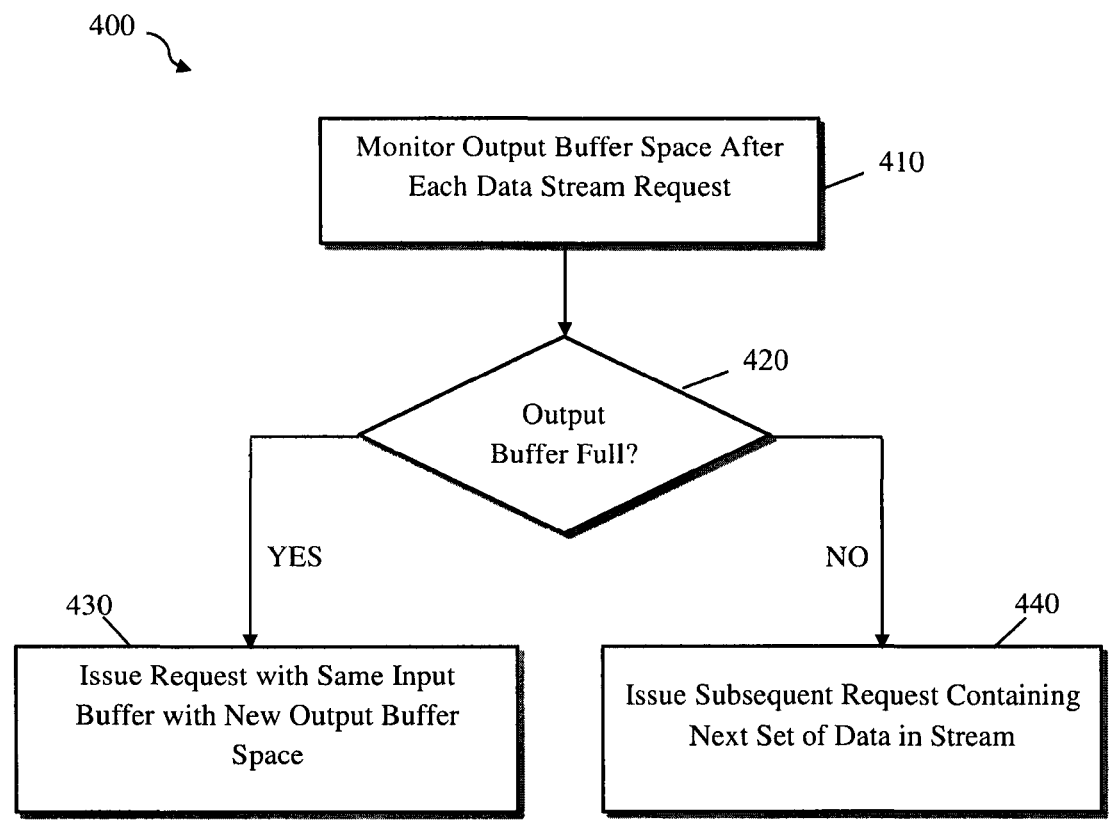
FIG. 4 depicts a flow diagram of a process for buffer matching according to an embodiment.

Referring to FIG. 4, a flow diagram depicting a process 400 for buffer matching according to an embodiment is generally shown. According to an embodiment, the process 400 for buffer matching may be implemented by the processing unit 16 of the computing system 10 shown in FIG. 1. At block 410, the space available in the output buffer 260 is monitored after each request according to an embodiment.

The amount of data processed by an individual request from the input buffer 250 is provided back to the host driver 220. This value is valid in either the case where the output buffer 260 is completely full or not.

In block 420, an embodiment determines whether the output buffer 260 is full or not. Responsive to the output buffer 260 being completely full on a return from an inflate/deflate request, the application 240 may assume that not all of the input buffer 250 has been processed and may make a new request with the same input buffer 250 with new output buffer space, as shown in block 430. The input buffer 250 will begin processing at the last byte of unprocessed data by having the host driver 220 manipulate the input buffer 250 to start at the correct point.

When the output buffer 260 is being returned not completely full on return from the inflate/deflate request, the application 240 may assume that all data of the input buffer 250 has been processed and may submit a subsequent request containing the next set of data in the stream to be inflated/deflated, as shown in block 440.

If there is room in the output buffer 260 when the compression accelerator 210 reaches the last group of bytes to process and the size of data produced by processing this last group of bytes is larger than the remaining space in the application's output buffer 260, the compression accelerator 210 will still need to process the last group of bytes. According to an embodiment, the compression accelerator 210 needs to process this last group of bytes since it must fill the application's output buffer 260 unless all the input data has been processed.

Figure 5:
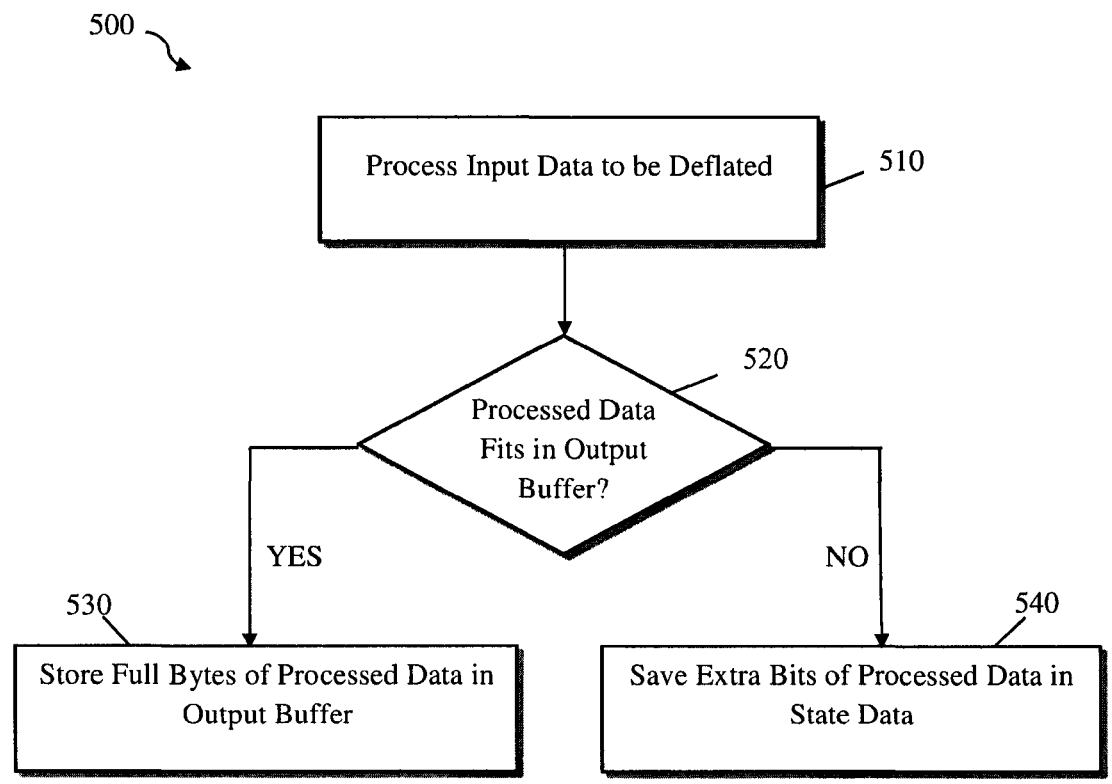
FIG. 5 depicts a flow diagram of process for handling overflow data during deflate processing according to an embodiment.

Referring to FIG. 5, a process 500 for handling overflow data during deflate processing according to an embodiment is shown. For deflate processing, the input bytes may be converted to Huffman Symbols representing either the bytes themselves or a length, distance pairing representing a match in the dictionary, as shown in block 510. At block 520, a determination is made as the whether the output buffer 260 would fit all the bits of the processed Huffman Symbols, according to an embodiment.

Responsive to determining that the output buffer 260 would fit all the bits of the processed Huffman Symbols, the processed Huffman Symbols are bit aligned and the compression accelerator 210 will insert all full bytes into the output buffer 260, as shown in block 530. Otherwise, responsive to determining that the output buffer 260 will only fit a subset of the bits of the processed Huffman Symbols, the final byte, which only contains a subset of bits related to the output, will be provided back in the stream state along with the count of bits which are part of the output, as shown in block 340. According to an embodiment, it is the responsibility of the host driver 220 to provide state data to the compression accelerator 210 on the next request. Accordingly, these remaining bits can be added to the output buffer 260 of the next request for the stream before any additional input data is processed.

Figure 6:
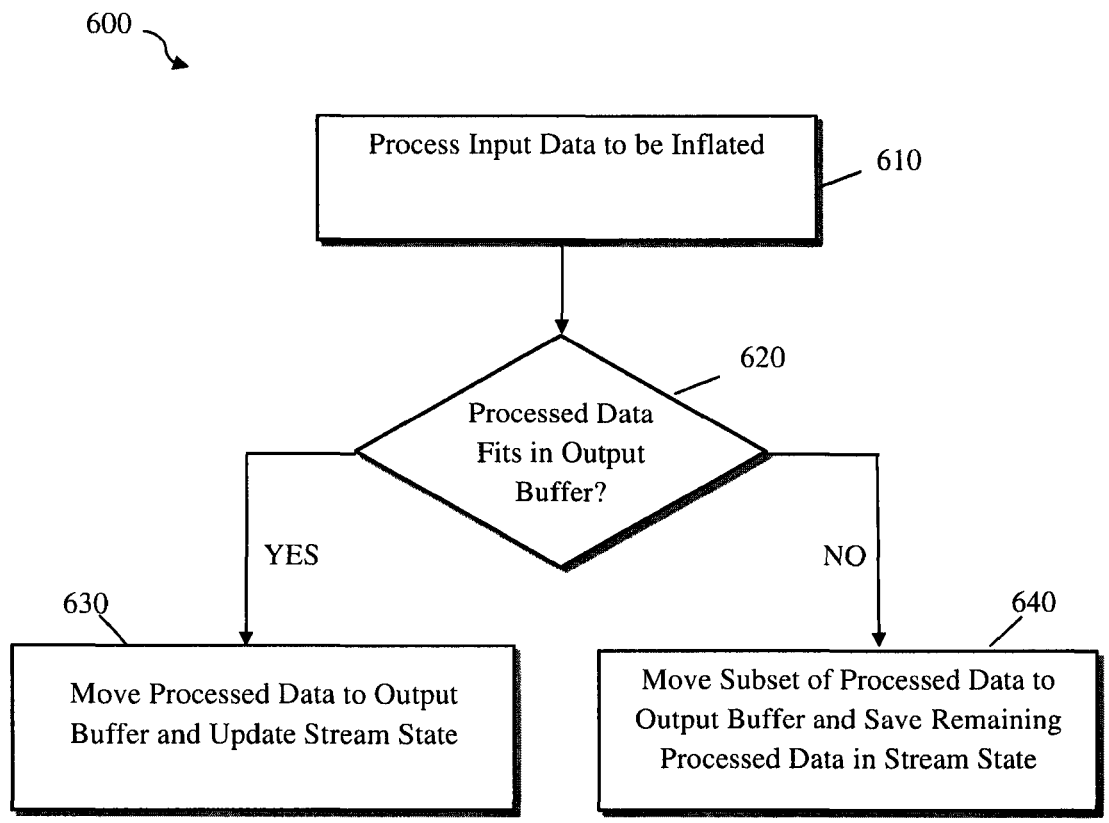
FIG. 6 depicts a flow diagram of a process for handling overflow data during inflate processing according to an embodiment.

Referring to FIG. 6, a process 600 for handling overflow data during inflate processing according to an embodiment is shown. For inflate processing, the compression accelerator 210 processes a group of Huffman Symbols to be expanded, as shown in block 610. At block 620, a determination is made as the whether the output buffer 260 would fit the results from the inflate processing of the Huffman Symbols, according to an embodiment.

Responsive to determining that the output buffer 260 would fit all the results from the inflate processing, the results are moved into the output buffer 260, as shown in block 630.

According to an embodiment, the dictionary of the state data is updated as the stream is processed.

Responsive to determining that the output buffer 260 would only fit a subset of the results from the inflate processing, the compression accelerator 210 will fill the application's output buffer 260 with as much of the results from processing this group of bytes as fits, as shown in block 640. This value may be up to several hundred bytes for a single Huffman Symbol as that is the longest length value allowed by the RFC minus one. According to an embodiment, the remaining results may be saved in the dictionary of the stream state along with a count of the number of bytes which are represented in the dictionary. According to an embodiment, the host driver 220 may move the remaining results to the application's output buffer 260 before the next request for the stream is sent to the compression accelerator 210.

During the next request processing of input buffer 250 will begin with symbols which will resolve repeated string matching back into the dictionary. Since the extra output bytes have been placed into the dictionary this may be the required location for them in order for the compression accelerator 210 to process the next request.

Figure 7:
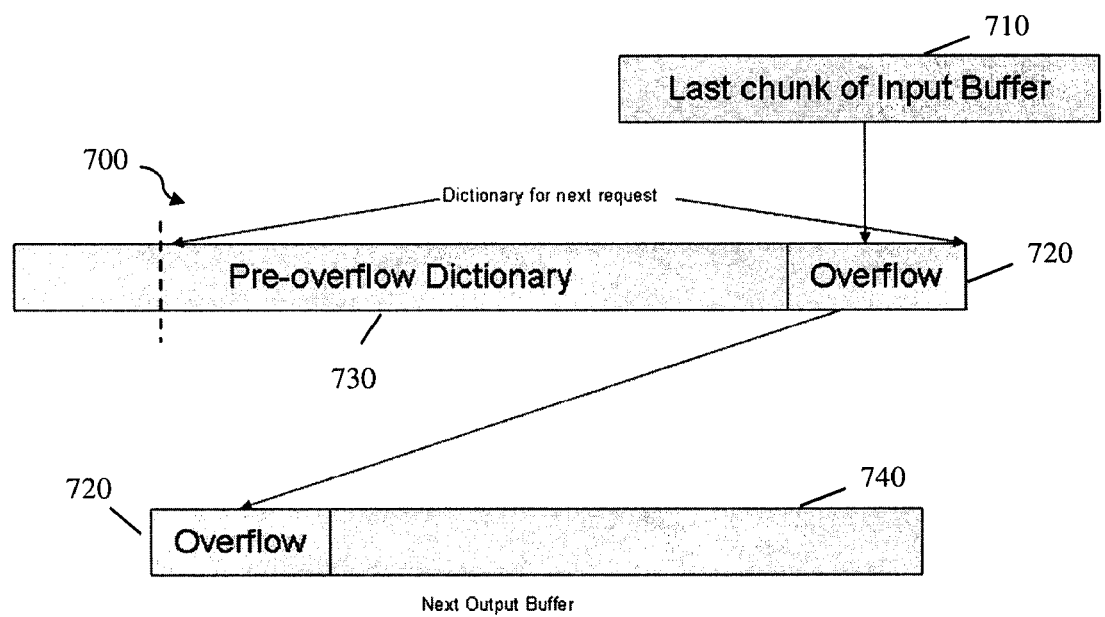
FIG. 7 depicts a diagrammatic representation of a dictionary for a next request according to an embodiment.

With respect to FIG. 7, a diagrammatic representation of a dictionary 700 for a next request according to an embodiment is shown. Referring to FIG. 7, a last chunk of the input buffer 710, which does not fit after being inflated into a previous output buffer, is saved as an overflow 720 in the dictionary 700 along with pre-overflow dictionary data 730. Thus, according to an embodiment, the overflow data 720 stored in the dictionary 700 may be input to the next output buffer 740 during the next request as discussed above.

Technical effects and benefits include providing a data stream interface for inflating/deflating data that can offload processing to a stateless compression accelerator. Embodiments allow the inflated/deflated data to be broken up across an arbitrary number of requests to the compression accelerator with no state kept between requests by the compression accelerator. Further, embodiments match the amount of input data processed for one request to the amount of output buffer space provided by the application. Additionally, embodiments overcome issues arising from the fact that data compressed in the DEFLATE format is a bit string but application input and output buffers are byte aligned. Embodiments also enable support for zlib compatible application interfaces to inflate/deflate data streams with the compression accelerator, thus allowing applications to exploit the compression accelerator with no code changes. Given the wide use of zlib in applications requiring compression services, embodiments significantly increase the value of the compression accelerator.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

Further, as will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer-implemented method, comprising:
   transmitting, by an electronic host driver processing device included in an electronic host system, a request to inflate or deflate a data stream to a compression accelerator that is excluded from the host system, the request comprising references to an input buffer for storing input data from the data stream, an output buffer for storing processed input data, and a state data control block included in the host driver to store a stream state;
   providing the stream state to the compression accelerator to continue processing the data stream responsive to the request being a subsequent request;
   instructing the compression accelerator to store a current stream state in the state data control block responsive to the request being a non-final request;
   receiving the current stream state from the compression accelerator responsive to the request being a non-final request; and
   receiving the processed input data from the compression accelerator,
   in response to the request being a final request, generating a command via the host driver that instructs the compression accelerator to transfer the current stream state back to the state data control block included in the host driver such that the compression accelerator does not store a current stream state in the state data control block after receiving the final request to prevent leakage of information across requests.

2. The computer-implemented method of claim 1, wherein the stream state is provided to the compression accelerator beginning with a second request.

3. The computer-implemented method of claim 1, further comprising instructing the compression accelerator not to store a current stream state in the state data control block responsive to the request being a final request.

4. The computer-implemented method of claim 1, further comprising:
   monitoring an availability of space in the output buffer after each request;
   issuing a request referencing a previous input buffer with new output buffer space responsive to the output buffer being full; and
   issuing a request referencing a next set of data from the data stream responsive to the output buffer having space.

5. The computer-implemented method of claim 1, wherein an overflow of deflated data received from the compression accelerator is saved in the stream state and added to the output buffer of a next request.

6. The computer-implemented method of claim 1, wherein an overflow of inflated data received from the compression accelerator is saved in the stream state and is used to create an entire Huffman code when new input becomes available with a next request.

7. The computer-implemented method of claim 1, wherein the stream state comprises a dictionary and a Huffman Tree.

8. A computer program product, comprising:
   a non-transitory computer readable storage medium having program code embodied therewith, the program code executable by a processor for:
   transmitting via an electronic host driver processing device including in an electronic host system, a request to inflate or deflate a data stream to a compression accelerator that is excluded from the host system, the request comprising references to an input buffer for storing input data from the data stream, an output buffer for storing processed input data, and a state data control block included in the host driver to store a stream state;
   providing the stream state to the compression accelerator to continue processing the data stream responsive to the request being a subsequent request;
   instructing the compression accelerator to store a current stream state in the state data control block responsive to the request being a non-final request;

receiving the current stream state from the compression accelerator responsive to the request being a non-final request; and receiving the processed input data from the compression accelerator, in response to the request being a final request, generating a command via the host driver that instructs the compression accelerator to transfer the current stream state back to the state data control block included in the host driver such that the compression accelerator does not store a current stream state in the state data control block after receiving the final request to prevent leakage of information across requests.

9. The computer program product of claim 8, wherein the stream state is provided to the compression accelerator beginning with a second request and the compression accelerator is instructed not to store a current stream state in the state data control block responsive to the request being a final request.

10. The computer program product of claim 8, further comprising:

monitoring an availability of space in the output buffer after each request;

issuing a request referencing a previous input buffer with new output buffer space responsive to the output buffer being full; and issuing a request referencing a next set of data from the data stream responsive to the output buffer having space.

11. The computer program product of claim 8, wherein an overflow of deflated data received from the compression accelerator is saved in the stream state and added to the output buffer of a next request.

12. The computer program product of claim 8, wherein an overflow of inflated data received from the compression accelerator is saved in the stream state and is used to create an entire Huffman code when new input becomes available with a next request.

13. The computer program product of claim 8, wherein the stream state comprises a dictionary and Huffman Tree.

* * * * *